(12) United States Patent
Song

(10) Patent No.: US 11,879,945 B2
(45) Date of Patent: Jan. 23, 2024

(54) BATTERY DIAGNOSIS METHOD AND BATTERY DIAGNOSIS APPARATUS

(71) Applicant: MONA INC., Jeollabuk-do (KR)

(72) Inventor: Chang Hee Song, Seoul (KR)

(73) Assignee: MONA INC., Jeollabuk-do (KR)

( * ) Notice: Subject to any disclaimer, the term of this patent is extended or adjusted under 35 U.S.C. 154(b) by 0 days.

(21) Appl. No.: 18/161,903

(22) Filed: Jan. 31, 2023

(65) Prior Publication Data

US 2023/0168306 A1 Jun. 1, 2023

Related U.S. Application Data

(63) Continuation of application No. PCT/KR2022/013472, filed on Sep. 7, 2022.

(30) Foreign Application Priority Data

Oct. 14, 2021 (KR) .......................... 10-2021-0136823

(51) Int. Cl.
*G01R 31/367* (2019.01)
*G01R 31/3842* (2019.01)
*G01R 31/374* (2019.01)
*G06N 5/022* (2023.01)

(52) U.S. Cl.
CPC ......... *G01R 31/367* (2019.01); *G01R 31/374* (2019.01); *G01R 31/3842* (2019.01); *G06N 5/022* (2013.01)

(58) Field of Classification Search
CPC .... G01R 31/36; G01R 31/367; G01R 31/374; G01R 31/3842; G01R 31/389; G01R 31/392
See application file for complete search history.

(56) References Cited

U.S. PATENT DOCUMENTS

| | | | |
|---|---|---|---|
| 10,310,020 | B2 | 6/2019 | Biletska et al. |
| 11,009,556 | B2 | 5/2021 | Soejima et al. |
| 11,368,030 | B2 | 6/2022 | Belkacem-Boussaid et al. |
| 2013/0135110 | A1* | 5/2013 | Xie ...................... G08B 29/181 340/636.11 |
| 2020/0164763 | A1* | 5/2020 | Holme .................... B60L 58/10 |

(Continued)

FOREIGN PATENT DOCUMENTS

| | | |
|---|---|---|
| EP | 3044601 | 12/2019 |
| JP | 2021108246 | 7/2021 |

(Continued)

OTHER PUBLICATIONS

"Office Action of Korea Counterpart Application", dated Dec. 15, 2021, with English translation thereof, p. 1-p. 11.

(Continued)

*Primary Examiner* — Michael J Dalbo
(74) *Attorney, Agent, or Firm* — JCIPRNET

(57) ABSTRACT

Provided are a battery diagnosis method and a battery diagnosis apparatus. The battery diagnosis apparatus receives time series data including at least one of a voltage, a current, and a temperature of a battery measured for a certain time period, receives non-time series data including battery impedance measured at a certain time point, and then predict the battery state information by inputting the time series data and the non-time series data to a battery prediction model.

4 Claims, 14 Drawing Sheets

(56) References Cited

U.S. PATENT DOCUMENTS

| | | | | |
|---|---|---|---|---|
| 2020/0218270 A1* | 7/2020 | Gu | .................. | G08G 5/0069 |
| 2021/0362622 A1* | 11/2021 | Kazuno | .................. | G07C 5/008 |
| 2022/0065939 A1* | 3/2022 | Senn | .................. | G01R 31/367 |
| 2022/0188700 A1* | 6/2022 | Khavronin | .......... | G06Q 30/0201 |
| 2022/0317193 A1 | 10/2022 | Munakata et al. | | |

FOREIGN PATENT DOCUMENTS

| | | |
|---|---|---|
| KR | 1020190022905 | 3/2019 |
| KR | 102140632 | 8/2020 |
| KR | 102171199 | 10/2020 |
| KR | 1020200119383 | 10/2020 |
| KR | 1020210077948 | 6/2021 |
| KR | 102292469 | 8/2021 |
| KR | 102424916 | 7/2022 |

OTHER PUBLICATIONS

"Notice of Allowance of Korea Counterpart Application", dated Jun. 20, 2022, with English translation thereof, p. 1-p. 3.

\* cited by examiner

BATTERY DIAGNOSIS METHOD AND BATTERY DIAGNOSIS APPARATUS

TECHNICAL FIELD

An embodiment of the present disclosure relates to a method and an apparatus for diagnosing states of a battery, such as a lifespan, a capacity, and an internal resistance, and more particularly, to a method and apparatus for diagnosing a battery state by using artificial intelligence (AI).

The application of the present disclosure was filed based on the results of a research conducted with the support of the Ministry of SMEs and Startups (Project No.: S3215392, Project Identification No.: 3215392000, Department Name: Ministry of SMEs and Startups, Research Management Organization: Korea Technology and Information Promotion Agency for SMEs, Research Program Name: Green Venture Program, Research Project Name: Development of world-class AI-based integrated warehousing inspection system for battery state-of-health diagnosis and defect detection, Execution Organization: MONA INC., Research Period: Apr. 1, 2022 to Mar. 31, 2025).

BACKGROUND ART

Various methods exist in the conventional art for predicting the lifespan and the like of a battery by using measured values such as a current or voltage of a battery and a temperature of the battery. However, because deterioration of a battery or fuel cell has very large nonlinearity, it is difficult to accurately capture the deterioration state of the battery by using basic measurement information such as a current, a voltage, and a tem perature.

DISCLOSURE

Technical Problem

Provided are a battery diagnosis method and a battery diagnosis apparatus capable of accurately ascertaining the state of a battery exhibiting non-linearity by considering time series data such as a current, a voltage, and a temperature of the battery and non-time series data including the impedance of the battery together.

Technical Solution

According to an aspect of the present disclosure, a battery diagnosis method performed by a computing device that drives a battery prediction model trained to predict battery state information includes receiving time series data including at least one of a voltage, a current, and a temperature of a battery measured for a certain time period; receiving non-time series data including battery impedance measured at a certain time point; and predicting the battery state information by inputting the time series data and the non-time series data to the battery prediction model.

According to another aspect of the present disclosure, as for a battery diagnosis apparatus the battery diagnosis apparatus includes a first input interface configured to receive time series data including at least one of a voltage, a current, and a temperature of a battery measured for a certain time period; a second input interface configured to receive non-time series data including battery impedance measured at a certain time point; and a predictor configured to predict the battery state information by inputting the time series data and the non-time series data to the battery prediction model.

Advantageous Effects

According to an embodiment of the present disclosure, the state of a battery may be accurately ascertained by considering time series data and non-time series data together.

MODE FOR INVENTION

A battery diagnosing method and a battery diagnosing apparatus according to an embodiment of the present disclosure will now be described in detail with reference to the accompanying drawings.

Figure 1:
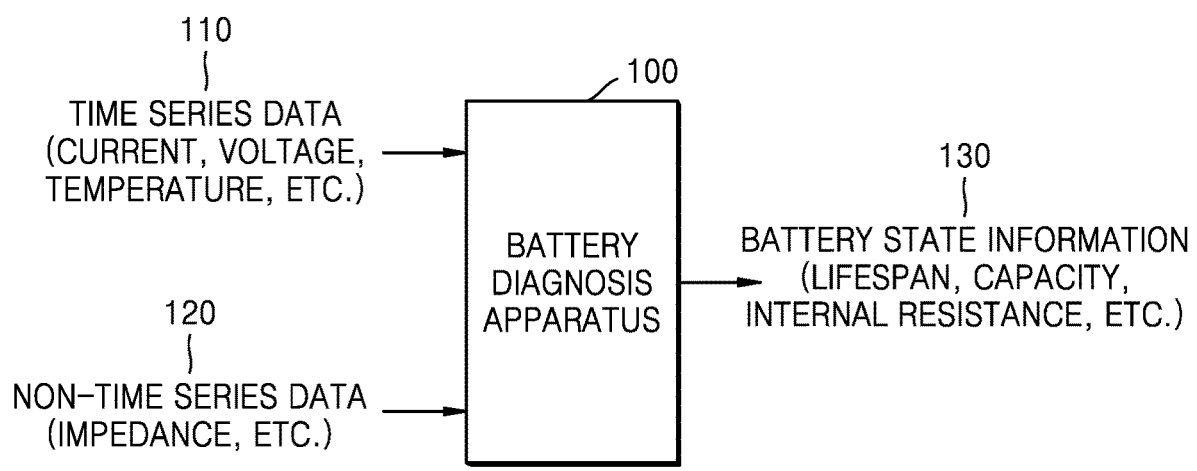
FIG. 1 is a diagram illustrating an example of a schematic structure of a battery diagnosis method according to an embodiment of the present disclosure.

FIG. 1 is a diagram illustrating an example of a schematic structure of a battery diagnosis method according to an embodiment of the present disclosure.

Referring to FIG. 1, a battery diagnosis apparatus 100 includes an artificial intelligence (AI) model (or a deep learning model) for predicting a battery state, based on battery measurement data. Hereinafter, the AI model for predicting the battery state is called a battery diagnosis model. The battery diagnosis model may be classified as a regression model. A structure of the battery diagnosis model will be described in detail with reference to FIGS. 3 through 6.

Figure 2:
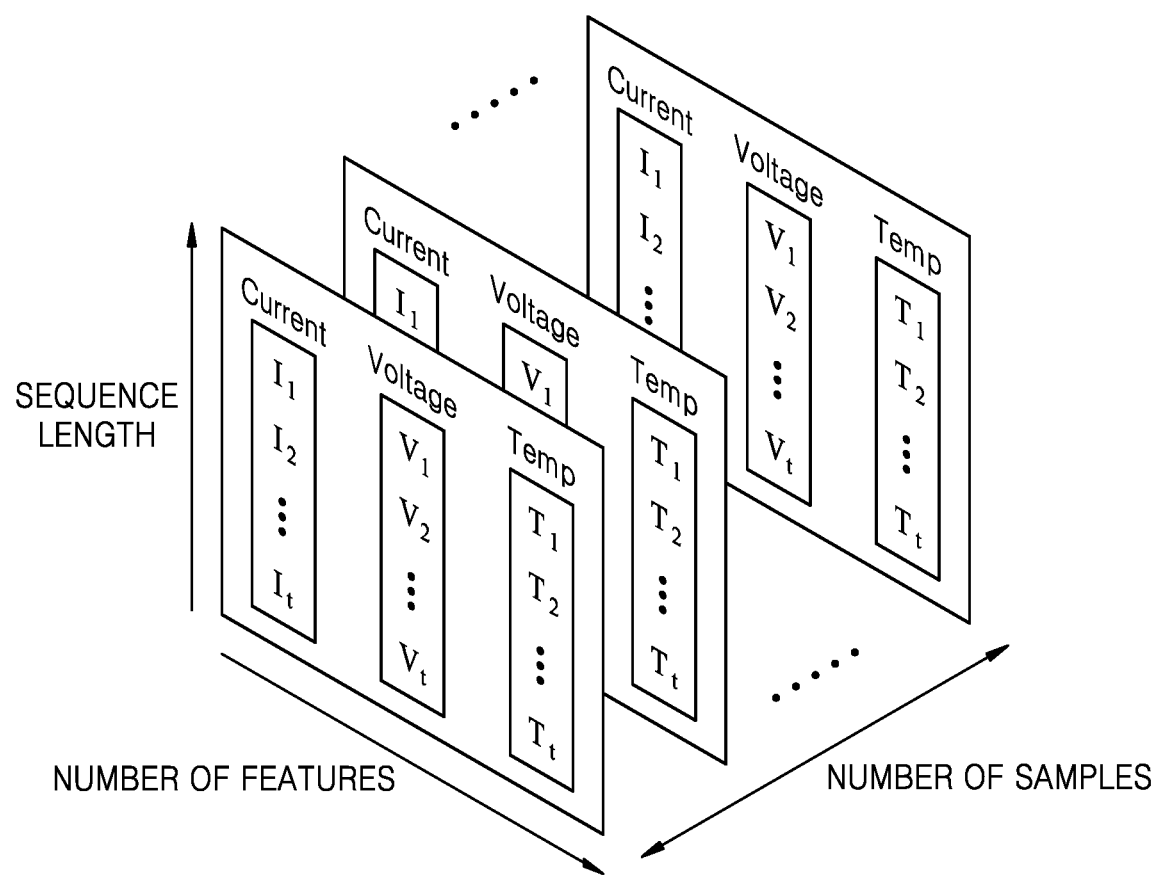
FIG. 2 illustrates an example of time series data for training a battery diagnosis model according to an embodiment of the present disclosure.

The battery measurement data is largely divided into time series data 110 and non-time series data 120. The time series data 110 may include at least one of a current, a voltage, and a temperature of a battery measured for a certain period (e.g., several months or several hours). The time series data 110 is data sequentially measured and accumulated according to the passage of time, and the present embodiment exemplifies the current, voltage, temperature, etc. of the battery, but embodiments of the present disclosure are not limited thereto. An example of the time series data 110 in a three-dimensional (3D) shape is illustrated in FIG. 2.

The non-time series data 120 includes impedance data, etc. of the battery measured at a certain time point. For example, the non-time series data 120 may be spectral data about battery impedance measured when predicting battery state information 130. The non-time series data 120 is data measured at a specific time point other than information accumulated over time, and the present embodiment presents impedance information as an example of the non-time series data 120, but embodiments of the present disclosure are not limited thereto. The impedance information of the battery included in the non-time series data 120 may be information measured using a plurality of different sine wave signals. For example, the non-time series data 120 may be an array structure (e.g., impedance information=(frequency (f), real-axis value (Re), imaginary-axis value (Im)) composed of a real-axis value and an imaginary-axis value according to a frequency on a nyquist plot. When the impedance information is measured for only one frequency, frequency information may be omitted from the non-time series data 120. A method of ascertaining the impedance of a battery by using a sine wave signal will be described again with reference to FIGS. 9 through 14.

The battery state information 130 predicted using the battery diagnosis model by the battery diagnosis apparatus 100 may include at least one of a lifespan, a capacity, and an internal resistance of the battery. The battery state information 130 may be various other information according to embodiments, but embodiments of the present disclosure are not necessarily limited thereto.

The battery diagnosis model, which is a battery state inference model, may be trained by supervised learning, and training data for the battery diagnosis mode includes target data. For example, the training data may include the time series data 110 and the non-time series data 120 of at least one battery, and the battery state information 130 used as target data. The battery diagnosis model may be created through a supervised learning process of adjusting internal parameters, etc., by comparing prediction information predicted using the time series data 110 and the non-time series data 120 included in the training data with battery state information that is the target data (i.e., a ground truth) included in the training data. The present disclosure newly proposes the internal structure of the battery diagnosis model in order to predict an accurate battery state by efficiently combining the time series data 110 with the non-time series data 120, and examples thereof are shown in FIGS. 3 through 6.

FIG. 2 illustrates an example of time series data for training a battery diagnosis model according to an embodiment of the present disclosure.

Referring to FIG. 2, the time series data 110 is composed of three features, namely, the voltage, the current, and the temperature of a battery. The time series data 110 includes information about a plurality of batteries, and is measured for a predetermined time period. Accordingly, the time series data 110 may be 3D data composed of three axes, namely, a plurality of features, a plurality of batteries (i.e., the number of samples), and a measurement period (i.e., a sequence length).

Figure 3:
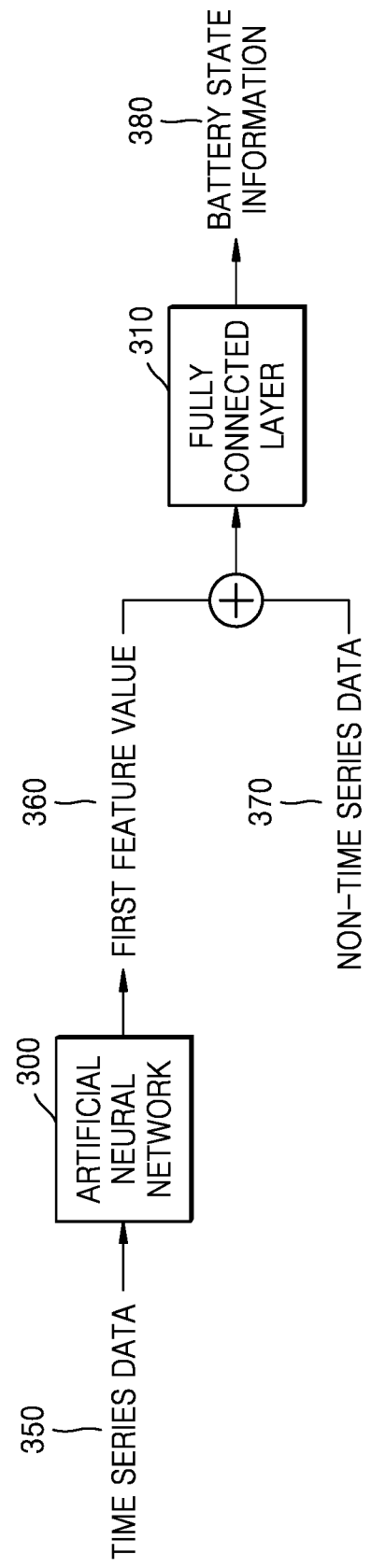
FIG. 3 is a diagram illustrating an example of a battery diagnosis model according to an embodiment of the present disclosure.

FIG. 3 is a diagram illustrating an example of a battery diagnosis model according to an embodiment of the present disclosure.

Figure 4:
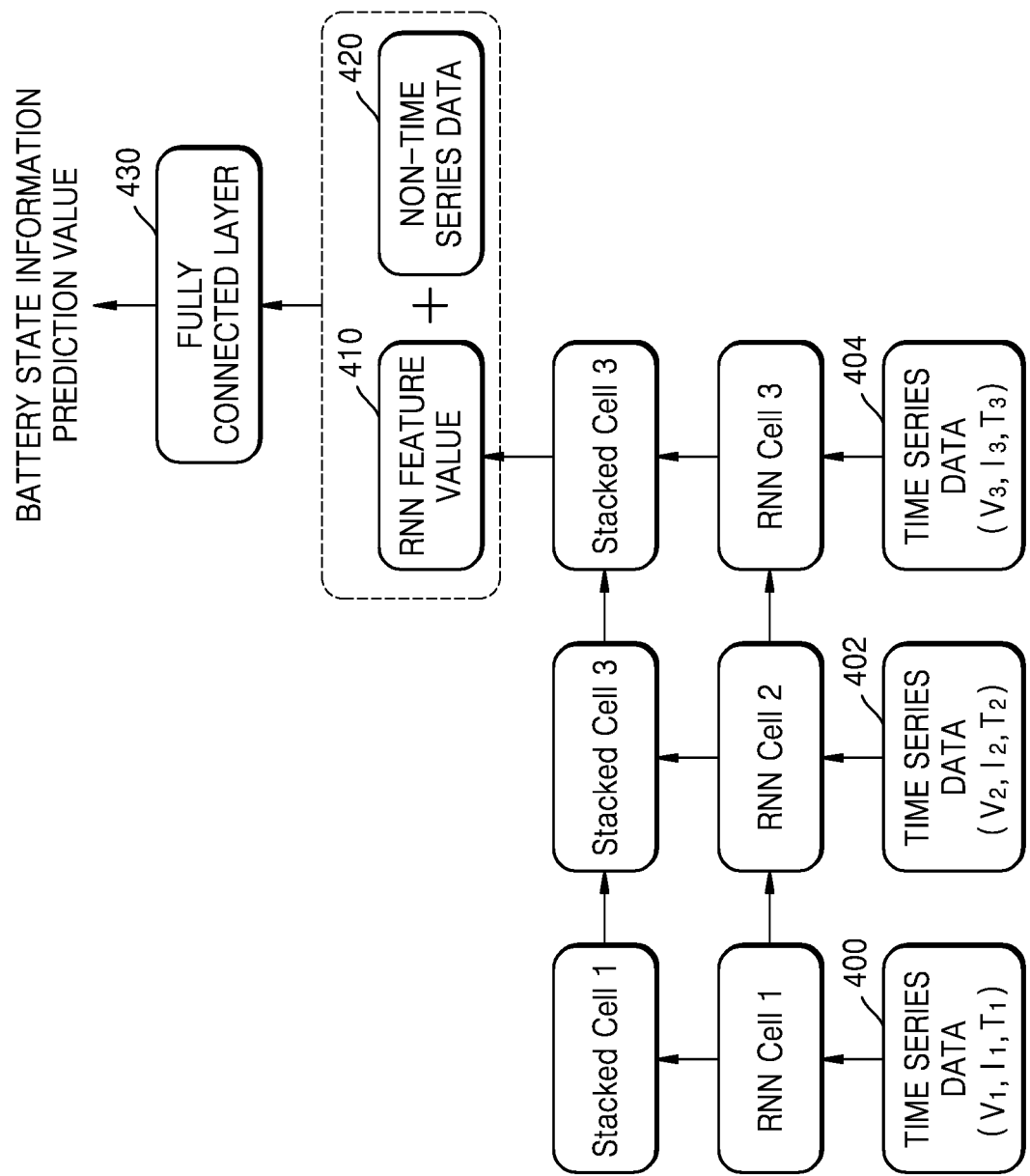
FIG. 4 is a diagram illustrating an example in which the artificial neural network of the battery diagnosis model of FIG. 3 is implemented as an RNN.

Referring to FIG. 3, the battery diagnosis model includes an artificial neural network 300 and a fully connected layer 310. The artificial neural network 300 may include a recurrent neural network (RNN), a convolutional neural network (CNN), or the like. An example in which the artificial neural network 300 is implemented as an RNN is shown in FIG. 4. Of course, various other types of conventional artificial neural networks are applicable to the present embodiment.

The fully connected layer 310 is one of artificial neural network structures, and is a layer in which all neurons in a previous layer are connected to all neurons in a next layer. For example, the fully connected layer 310 may be used to flatten the feature values of a two-dimensional (2D) array into the feature values of a one-dimensional (1D) array and derive a final predicted value. According to the present embodiment, the fully connected layer 310 is used to predict a result of a battery state by integrating two data of different properties of non-time series data and time series data. Various types of conventional fully connected layers are applicable to the present embodiment.

According to the present embodiment, two data of different properties of time series data 350 and non-time series data 370 are used as input data of the battery diagnosis model. Input data of the artificial neural network 300 is the time series data 350, and input data of the fully connected layer 310 is data obtained by combining an output value of the artificial neural network 300 (i.e., a first feature value 360) with the non-time series data 370.

The battery diagnosis model may perform preprocessing (e.g., normalization or outlier removal) on time series data, and make the time series data in a vector form and input the time series data in vector form to the artificial neural network 300. For example, the battery diagnosis model may introduce a batch normalization layer for normalizing input data to an input layer of the artificial neural network 300 in order to prevent instability of learning. The batch normalization layer may increase the stability of learning by processing the average value and standard deviation of the input data to be distributed around 0 and 1.

The first feature value 360 output by the artificial neural network 300 may be composed of one or more features, and this may be implemented in various ways according to embodiments. The battery diagnosis model generates a second feature value by concatenating the non-time series data 370 and the first feature value 360, and inputs the second feature value to the fully connected layer 310 to predict battery state information 380.

FIG. 4 is a diagram illustrating an example in which the artificial neural network of the battery diagnosis model of FIG. 3 is implemented as an RNN.

Referring to FIG. 4, the artificial neural network 300 of the battery diagnosis model of FIG. 3 may be implemented with RNN-based cells (e.g., long short term memories (LSTMs) or gated recurrent units (GRUs). Because the RNN recursively inputs time series data 400, 402, and 404 from the current point in time to a certain time point in the past, the RNN is effective for a prediction model for time series data.

In the RNN, a representative RNN value is generated for each RNN cell corresponding to each time step. The present embodiment is implemented as a network structure in which the RNN feature value of a last RNN cell corresponding to the most recent time step is combined with impedance data. In other words, non-time series data (i.e., impedance data) 420 is combined with a feature value 410 generated through the RNN, rather than being directly combined with the time series data. A feature value obtained by combining the output value 410 of the RNN with the non-time series data 420 is input to a fully connected layer 430, so that battery state information is predicted.

For convenience of explanation, the present embodiment shows an example in which an RNN cell and a stacked cell are each shown as one layer and three time series data are input, but this is only an example. Embodiments of the present disclosure are not limited thereto.

Figure 5:
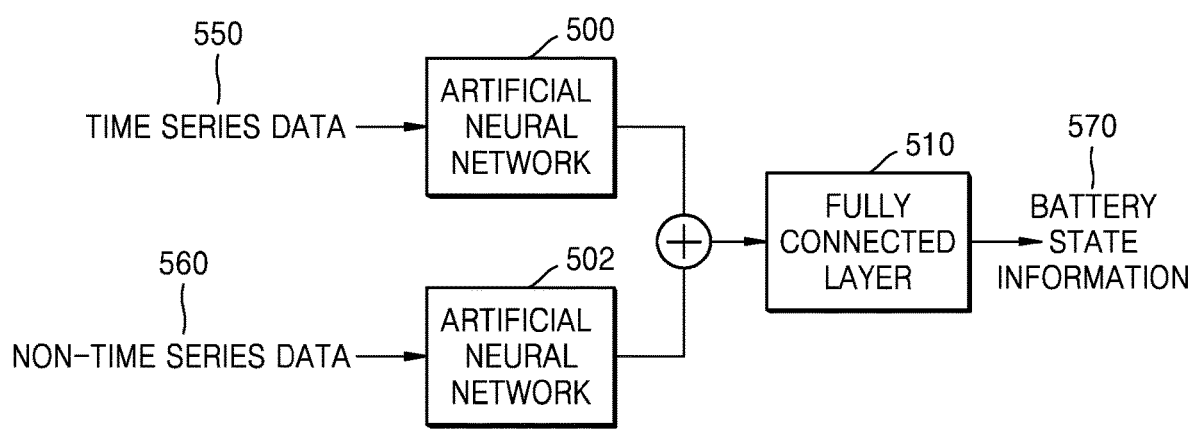
FIG. 5 is a diagram illustrating another example of a battery diagnosis model according to an embodiment of the present disclosure.

FIG. 5 is a diagram illustrating another example of a battery diagnosis model according to an embodiment of the present disclosure.

Referring to FIG. 5, the battery diagnosis model includes a plurality of artificial neural networks 500 and 502 and a fully connected layer 510. The plurality of artificial neural networks 500 and 520 may be implemented as CNNs, and an example thereof is shown in FIG. 6.

The artificial neural networks 500 and 502 receive time series data 550 and non-time series data 560, respectively, and output respective first feature values. The battery diagnosis model generates a second feature value by connecting the respective first feature values to each other, and inputs the second feature value to the fully connected layer 510 to predict battery state information 570.

Figure 6:
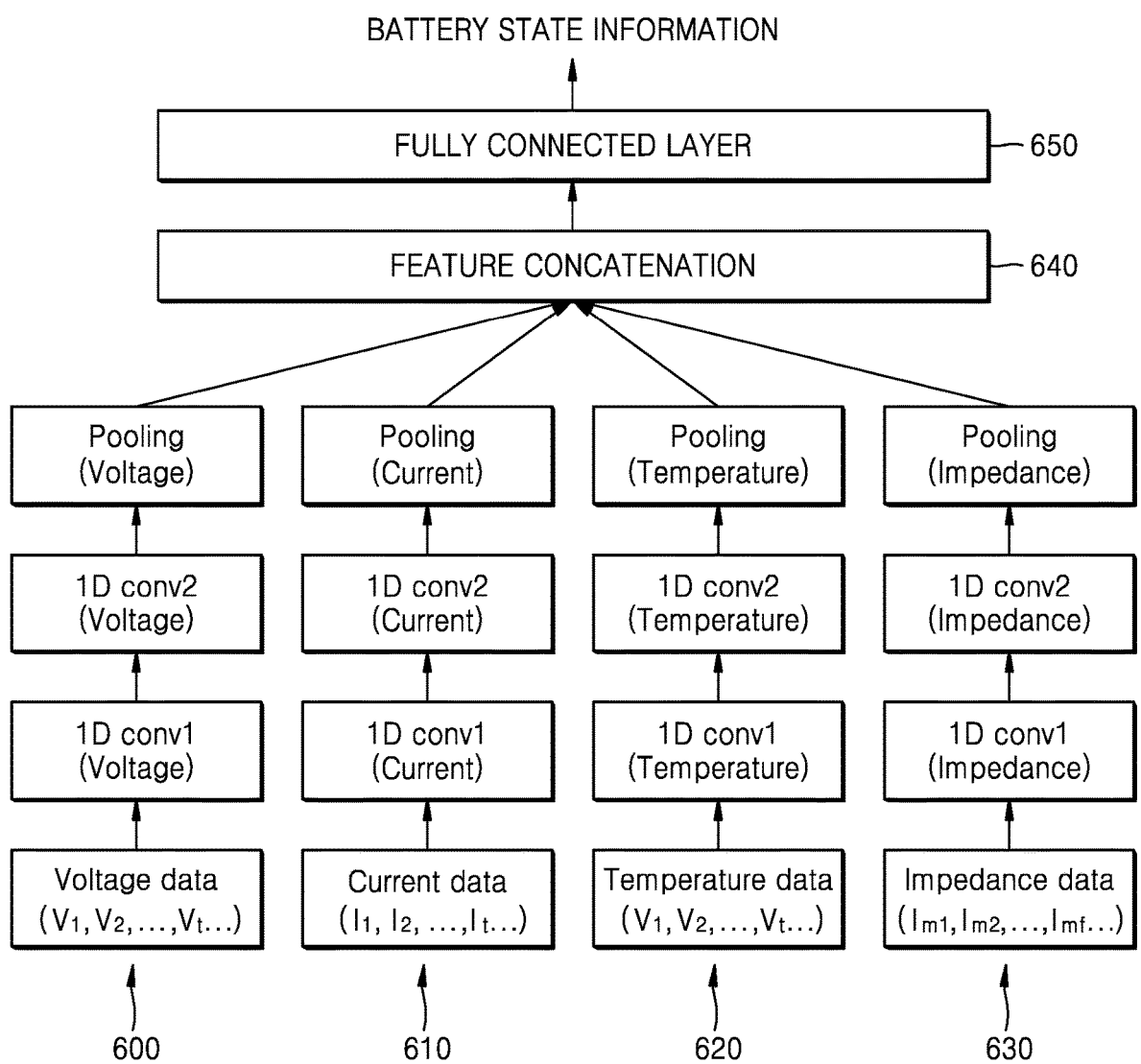
FIG. 6 is a diagram illustrating an example in which the artificial neural network of the battery diagnosis model of FIG. 5 is implemented as a CNN.

FIG. 6 is a diagram illustrating an example in which the artificial neural network of the battery diagnosis model of FIG. 5 is implemented as a CNN.

Referring to FIG. 6, the battery diagnosis model is composed of a 1D CNN. The CNN may be used to capture local connectivity between features of input data including time series data 600, 610, and 620 and non-time series data 630. For example, in order to ascertain local connectivity of a voltage 600, a current 610, and a temperature 620, which are features of time series data, over time and capture local connectivity of frequency with respect to impedance 630, which is non-time series data, the battery diagnosis model according to the present embodiment includes a 1D convolutional layer (1D Conv.) and a pooling layer.

The battery diagnosis model integrates and flattens respective feature values obtained by inputting the time series data 600, 610, and 620 and the non-time series data 630 to a 1D convolutional layer, through a concatenation layer 640, and finally predicts battery state information through a fully connected layer 650.

Figure 7:
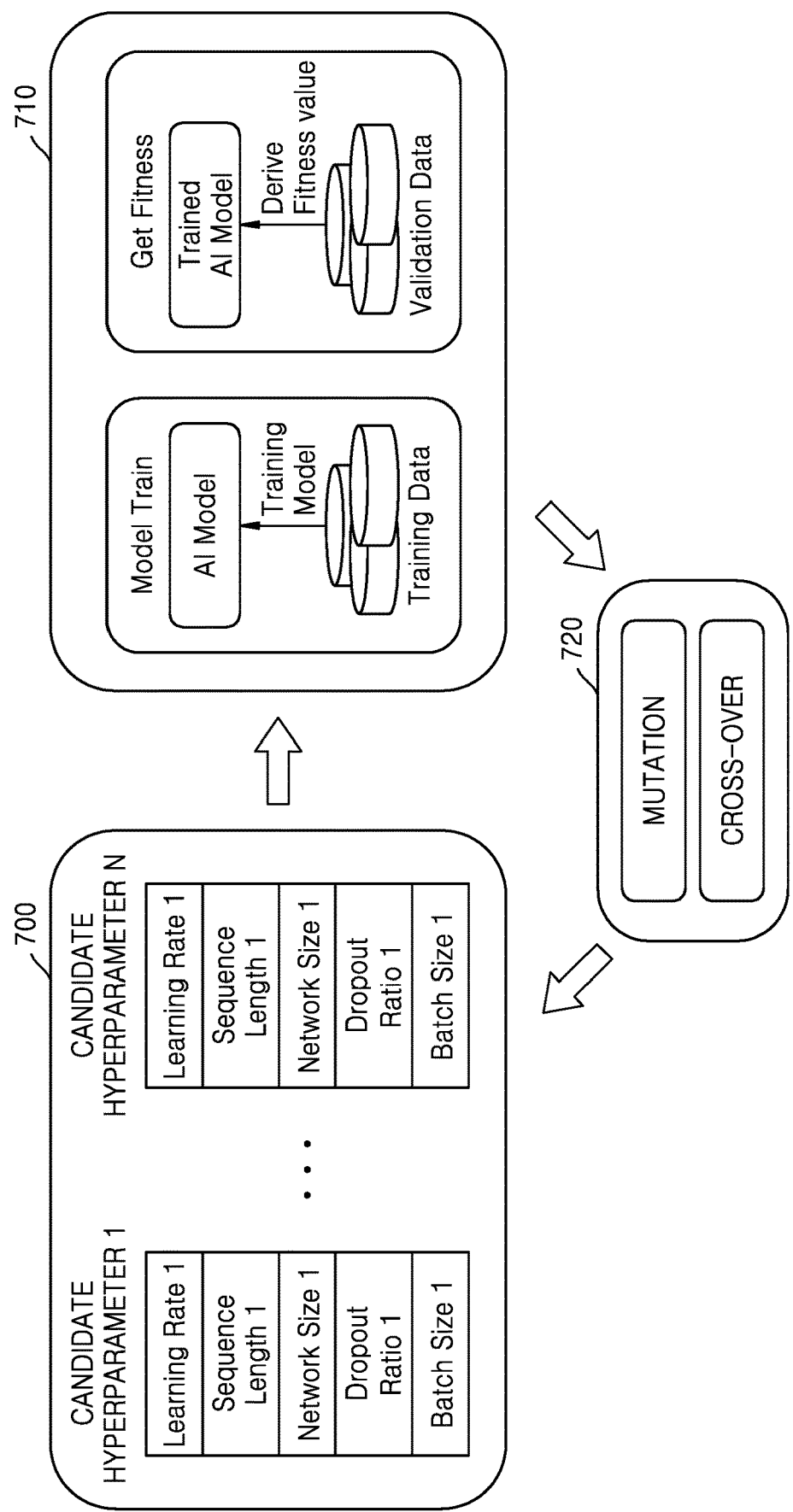
FIG. 7 is a diagram illustrating an example of a method, performed by a battery diagnosis model according to an embodiment of the present disclosure, of optimizing a hyperparameter.

FIG. 7 is a diagram illustrating an example of a method, performed by a battery diagnosis model according to an embodiment of the present disclosure, of optimizing a hyperparameter.

Referring to FIG. 7, the performance of the battery diagnosis model may vary according to hyperparameters. For example, since there are many hyperparameters such as a sequence length of time series data, a network structure (such as, a stack size of an RNN), a learning rate, and a drop-out ration, the performance of the battery diagnosis model may be improved through an optimal combination of these hyperparameters.

Because the number of hyperparameters is large, a brute-force method of deriving optimal hyperparameters by applying all possible combinations of the hyperparameters is inefficient. Accordingly, the present embodiment proposes a method of deriving an optimal hyperparameter through a genetic algorithm.

First, a battery diagnosis apparatus trains the battery diagnosis model, based on a plurality of candidate hyperparameters 700 (operation 710). It is assumed that the plurality of candidate hyperparameters 700 are predefined in various ways. For example, the plurality of candidate hyperparameters 700 may be configured of arbitrary values.

The battery diagnosis apparatus evaluates fitness values of a plurality of battery diagnosis models trained using the plurality of candidate hyperparameters 700 (operation 710). Various conventional methods for calculating a fitness value for a training result of the battery diagnosis model are applicable to the present embodiment. The battery diagnosis apparatus selects at least one candidate hyperparameter as a parent hyperparameter, based on the fitness value. For example, candidate hyperparameters used in top two battery diagnosis models in the order of high fitness may be selected as a parent hyperparameter.

The battery diagnosis apparatus adds, as a new candidate hyperparameter, at least one child hyperparameter generated through a process of crossing over some of parent hyperparameters or mutating the parent hyperparameters (operation 720).

The battery diagnosis apparatus repeatedly performs a process of training the battery diagnosis model by using at least one new candidate hyperparameter, evaluating the fitness value of the trained battery diagnosis model, and selecting a candidate hyperparameter of the battery diagnosis model with a high fitness value as a parent hyperparameter, and generating a child hyperparameter from the parent hyperparameter, until a predefined condition is met or a predefined number of times is reached. Through this iterative process, optimal hyperparameters may be derived. For example, the battery diagnosis apparatus may define, as a stopping point, a point at which a fitness curve obtained by connecting fitness values ascertained each time to each other is saturated (that is, a point at which the increase rate of the fitness value becomes less than a certain level in each iterative process).

Figure 8:
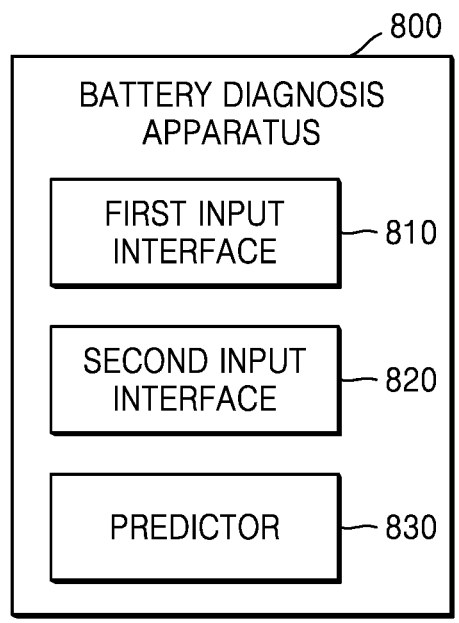
FIG. 8 is a block diagram of a structure of an example of a battery diagnosis apparatus according to an embodiment of the present disclosure.

FIG. 8 is a block diagram of a structure of an example of a battery diagnosis apparatus according to an embodiment of the present disclosure.

Referring to FIG. 8, a battery diagnosis apparatus 800 may include a first input interface 810, a second input interface 820, and a predictor 830. The battery diagnosis apparatus 800 may be implemented as a computing device including a memory, a processor, an input/output device, etc. In this case, each configuration may be implemented in software, and then mounted in the memory and performed by the processor.

The first input interface 810 receives time series data such as a voltage, a current, or a temperature of a battery measured for a predetermined time period. The second input interface 820 receives non-time series data such as impedance of the battery measured at a certain time point.

The predictor 830 predicts battery state information by inputting the time series data and the non-time series data to a training-completed battery prediction model. For example, as shown in FIG. 3 or 5, the predictor 830 may generate a first feature value by inputting the time series data to an artificial neural network of the battery prediction model, generate a second feature value by combining a first output value of the artificial neural network with the impedance of the battery, and output battery state information by inputting the second feature value to a fully connected layer of the battery prediction model.

Figure 9:
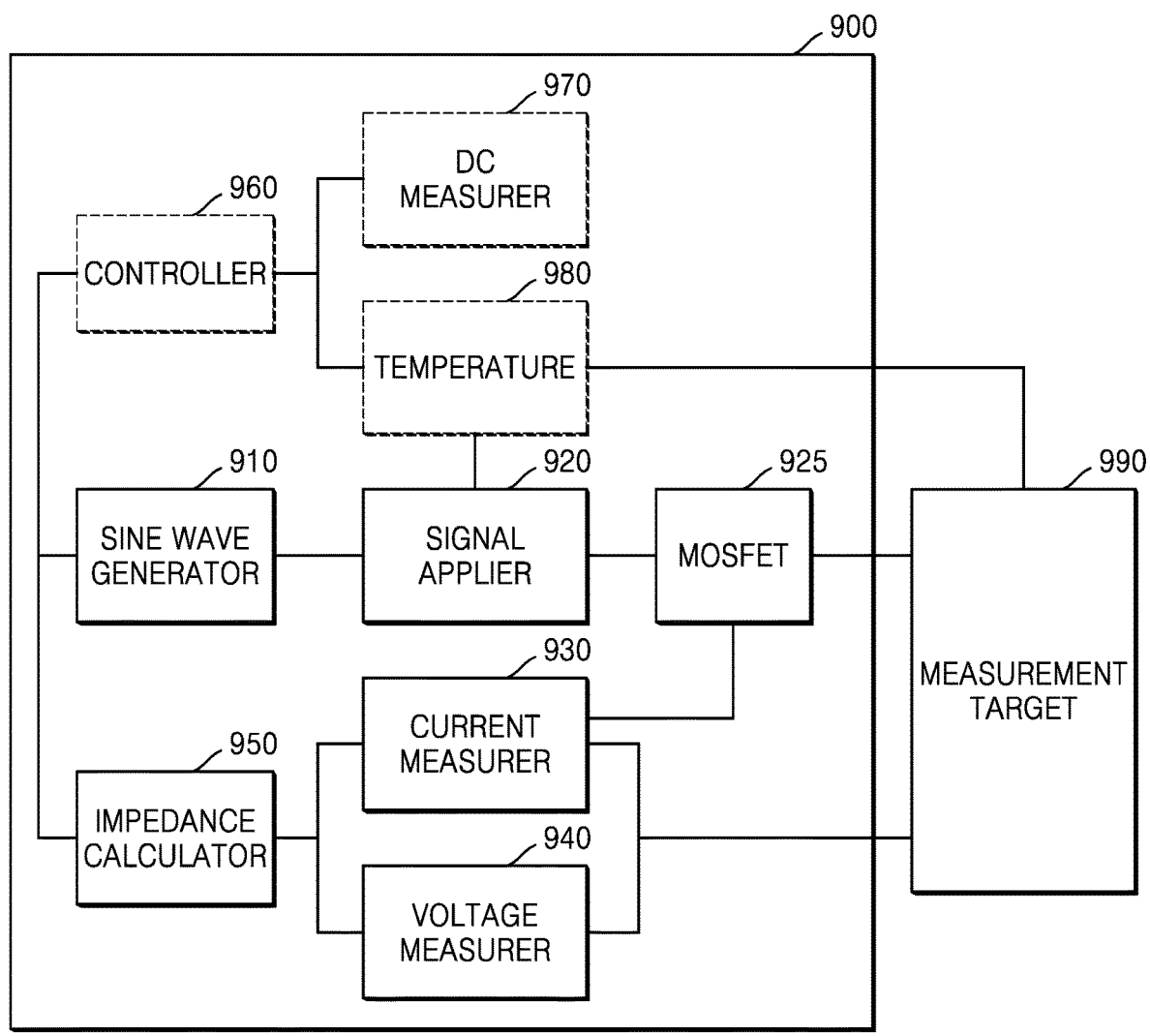
FIG. 9 is a block diagram of a structure of an example of an impedance measuring apparatus according to an embodiment of the present disclosure.

FIG. 9 is a block diagram of a structure of an example of an impedance measuring apparatus according to an embodiment of the present disclosure.

Referring to FIG. 9, an impedance measuring apparatus 900 includes a sine wave generator 910, a signal applier 920, a current measurer 930, a voltage measurer 940, and an impedance calculator 950. In another embodiment, the impedance measuring apparatus 900 may further include a controller 960, a direct current (DC) measurer 970, and a temperature measurer 980. The present embodiment is described on the assumption that the controller 960, the DC measurer 970, and the temperature measurer 980 are included, for convenience of description, but the corresponding components may be omitted.

Figure 10:
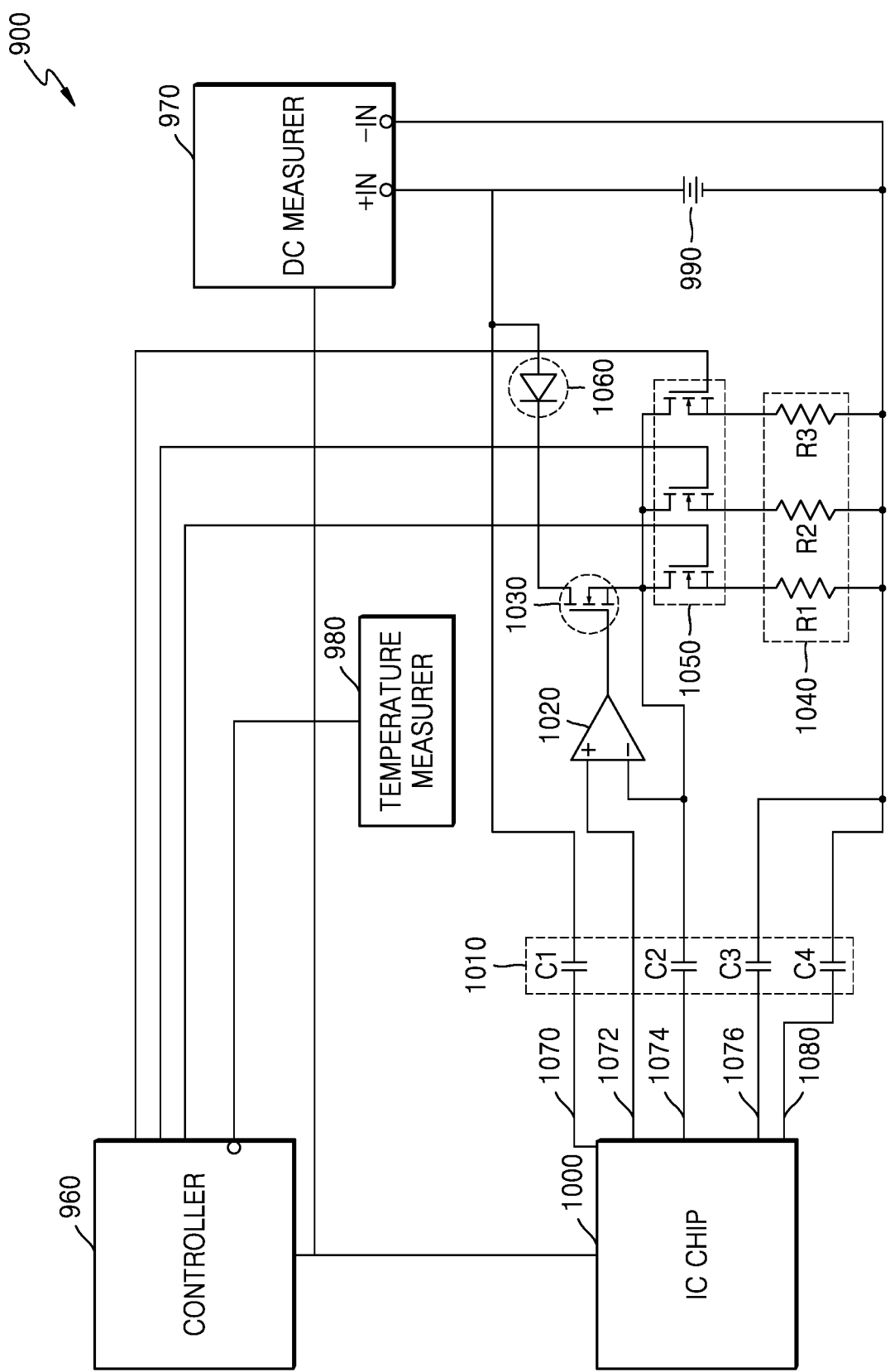
FIG. 10 is a block diagram of an impedance measuring apparatus according to an embodiment of the present disclosure.
Figure 13:
FIG. 13 is a view illustrating an example of a sine wave signal generated to achieve impedance measurement according to an embodiment of the present disclosure.

The sine wave generator 910 generates a sine wave signal within a certain frequency range. For example, the sine wave generator 910 may generate a plurality of sine wave signals having different frequencies in various frequency ranges from 0.1 Hz to 5 kHz. The frequency range of the sine wave signal may be modified to various other ranges according to embodiments. The magnitude of the sine wave signal may vary according to embodiments, like several mV to several tens of V. An example of the sine wave signal generated by the sine wave generator 110 within the certain frequency range is shown in FIG. 13. In another embodiment, the sine wave generator 910 may be implemented as an IC chip that generates a sine wave as shown in FIG. 10. The sine wave generator 910 may also be implemented by applying various conventional techniques for generating a sine wave.

The signal applier 920 applies a sine wave signal to a gate electrode of a Metal Oxide Semiconductor Field Effect Transistor (MOSFET) 925 connected to a measurement target 990. In other words, the gate electrode of the MOSFET 925 is connected to the signal applier 920, and a drain electrode thereof is connected to the measurement target 990. The measurement target 990 is a target device of which impedance is to be ascertained, for example, a battery (i.e., a secondary battery). The present embodiment is described on the assumption that the measurement target 990 is a battery, for convenience of description, but the measurement target 990 may vary other than a battery.

In another embodiment, the signal applier 920 may include an amplifier that performs amplification so that a small sine wave signal output by the sine wave generator 910 becomes a gate voltage of a size suitable for driving the MOSFET 925, and a feedback circuit that enables an output of the amplifier to exist within a certain range. Because the configuration of the signal applier 920 including the amplifier and the feedback circuit is shown in FIG. 10, this will be described again with reference to FIG. 10.

The current measurer 930 measures a current value of the measurement target 990 output by a source electrode of the MOSFET 925 when a sine wave signal is applied to the gate electrode of the MOSFET 925. A DC voltage (e.g., a battery voltage when a measurement target is a battery) of a certain size (e.g., several tens to several hundreds of V) of the measurement target 990 is applied to the drain electrode of the MOSFET 925, a sine wave signal is applied to the gate electrode of the MOSFET 925, and the MOSFET 925 outputs a current according to the magnitude of the sine wave signal through the source electrode in a linear operation region.

The current measurer 930 may be implemented as a structure for directly measuring a current. However, according to the present embodiment, the current measurer 930 calculates a current value by using a resistor that is aware of a resistance value in order to simplify the circuit structure of current measurement. For example, the current measurer 930 may measure the voltage of a resistor connected to the source electrode of the MOSFET 925, and then may ascertain the current value through a formula "current=voltage/resistance". In another embodiment, the magnitude of a current signal may be changed by change the magnitude of the resistance by connecting a plurality of resistors to one another in parallel. This will be described again with reference to FIG. 10.

The voltage measurer 940 measures a voltage value of the measurement target 990 according to the application of the sine wave signal. As the sine wave signal is applied to the gate electrode of the MOSFET 925, a current flows in the MOSFET 925, and accordingly, the voltage of the measurement target 990 changes. The voltage measurer 940 may be connected in series with the measurement target 990 to measure the voltage of the measurement target.

The current value measured by the current measurer 930 and the voltage value measured by the voltage measurer 940 may be values of an alternating current (AC) component from which a DC component has been removed. In order to obtain the values of the AC component from which the DC component has been removed, the current measurer 930 and the voltage measurer 940 may further include a structure (e.g., an AC coupler of FIG. 10) for removing the DC component. Various other conventional methods for ascertaining an AC component by removing a DC component from a voltage value and a current value are applicable to the present embodiment.

The impedance calculator 950 calculates the impedance of the measurement target, based on the current value ascertained by the current measurer 930 and the voltage value ascertained by the voltage measurer 940. The impedance calculator 950 may apply a Hamming window algorithm and discrete Fourier transform (DFT) to a finite number of current and voltage values ascertained at regular intervals, and may ascertain the impedance by using a Nyquist plot, etc. Because the method of obtaining the impedance by using a finite number of current and voltage values that change over time is a well-known technique, a detailed description thereof will be omitted.

The impedance calculator 950 may calculate the impedance of the measurement target with respect to sine wave signals of various frequencies. For example, the impedance calculator 950 may calculate a first impedance when a sine wave signal of a first frequency is applied, and calculate a second impedance when a sine wave signal of a second frequency is applied. An interval between the first frequency and the second frequency may be a log interval as shown in FIG. 5.

The temperature measurer 980 measures a temperature of the MOSFET 925 and the like. A portion of which a temperature is measured by the temperature measurer 980 may be implemented in various ways according to embodiments. When the temperature measured by the temperature measurer 980 is greater than or equal to a pre-defined temperature, the controller 960 may stop the operation of the impedance measuring apparatus 900 in order to prevent a fire or malfunction. The DC measurer 970 measures the DC voltage, etc. of the measurement target 990.

The controller 960 controls each component such as the sine wave generator 910. For example, the sine wave generator 910 may be controlled to generate sine wave signals of various frequencies. The controller 960 may be connected to each control target, such as the sine wave generator 910, through serial peripheral interface (SPI) communication. The controller 960 may transmit, for example, the frequency range of the sine wave signal and the number of measurement points to the sine wave generator 910.

FIG. 10 is a block diagram of an impedance measuring apparatus according to an embodiment of the present disclosure.

Referring to FIG. 10, the impedance measuring apparatus 900 includes an IC chip 1000 that generates a sine wave signal, an amplifier 1020 that amplifies the sine wave signal, a MOSFET 1030 that measures current and voltage changes according to application of the sine wave signal, a resistor unit 940 including a plurality of resistors connected to each other in parallel, and a switch 1050 that turns on/off each resistor connection. The present embodiment includes all of the controller 960, the temperature measurer 980, and the DC measurer 990 for comparison with FIG. 9, but these components may be omitted according to embodiments.

The IC chip 1000 generates the sine wave signal. In other words, the sine wave generator 910 of FIG. 9 may be implemented as an IC chip. Various conventional IC chips are applicable to the present embodiment. The sine wave signal generated by the IC chip 1000 is input to a gate electrode of the MOSFET 1030 (corresponding to the MOSFET 925 of FIG. 9) through the amplifier 1020, and an output of a source electrode of the MOSFET 1030 is fed back to the amplifier 1020. In other words, the signal applier 920 of FIG. 9 may be composed of the amplifying unit 1020 of the present embodiment and the feedback circuit. The IC chip 1000 may register, for example, the frequency range of the sine wave signal received by the controller 960 and the number of different frequencies to be generated within the frequency range in a register, and then generate the sine wave signal, based on them, and measure the impedance. The sine wave signal generated within the frequency range may be divided and generated at log intervals as in the example of FIG. 13. The IC chip 1000 may store, for example, a measured voltage value and a measured current value, in a FIFO (First In First Out) queue, and then calculate an impedance value for each frequency of the sine wave signal, based on the stored values.

The source electrode of the MOSFET 1030 is connected to the measurement target 990, and the gate electrode thereof is connected to the amplifier 1020. In the MOSFET 1030, a current flows in a linear region due to the sine wave signal input to the gate electrode and a voltage signal of the measurement target connected to the source electrode.

The resistor unit 1040 connected in parallel with the measurement target 990 is used to measure the current output by the source electrode of the MOSFET 1030. The IC chip 1000 measures the voltage value of the resistor 1040 through a third line 1074 and a fourth line 1076 connected to the resistor unit 1040, and calculates the current value output by the source electrode of the MOSFET 1030 by using the measured voltage value and the resistance value of the resistor unit 1040. In other words, the current measurer 930 of FIG. 9 may be implemented as the resistor unit 1040 and the IC chip 1000 of the present embodiment. An AC coupler 1010 including capacitors C2 and C4 may be positioned on the third line 1074 and the fourth line 1076 so that the IC chip 1000 may measure only the current value of the AC component.

Resistance values of the plurality of resistors of the resistor unit 1040 connected to each other in parallel are known in advance to the IC chip 1000 or the controller 960. For example, the resistor unit 1040 may be implemented as a shunt resistor. The present embodiment includes the switch unit 1050 capable of controlling the on/off of connection of the resistors constituting the resistor unit 1040 so that a measurable voltage range of the measurement target 990 may vary. Although the present embodiment shows an example in which the switch unit 1050 is implemented as a MOSFET connected in series with each of the resistors, embodiments of the present disclosure is not necessarily limited thereto. Because the resistance value of each of the resistors of the resistor unit 1040 is known in advance, the resistance value of the resistor unit 1040 may be obtained according to an operating state (i.e., an on/off state) of each switch of the switch unit 1050.

The switch unit 1050 may be controlled by the controller 960. In another embodiment, when the controller 960 and the IC chip 1000 are implemented as one component, the IC chip 1000 may control each of the switches. For convenience of explanation, a case where the controller 960 controls the switch unit 1050 will now be assumed and described. A method, performed by the controller 960, of controlling the switch unit 1050 according to the voltage magnitude of the measurement target 990 to adjust the resistance value of the resistor unit 1040 will be described again in FIG. 14.

The IC chip 1000 measures a voltage of the measurement target 990 according to application of the sine wave signal. For example, the IC chip 200 measures the voltage value of the measurement target 990 according to the application of the sine wave signal through a first line 1070 and a fifth line 1078 connected in series with the measurement target 990. An AC coupler 1010 including capacitors C1 and C4 may exist on the first line 1070 and the fifth line 1078 so that the IC chip 1000 may measure only the current value of the AC component from which the DC component has been removed. A diode 1060 may be further included between the MOSFET 1030 and the measurement target 990 to prevent a back electromotive force and serve as a rectifier.

Figure 11:
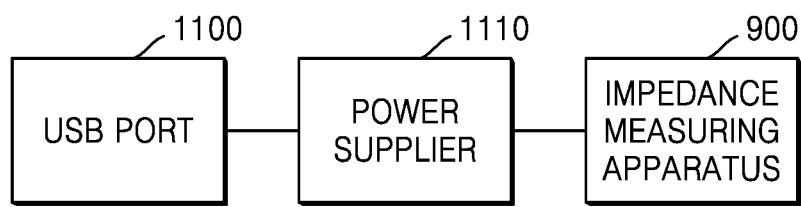
FIG. 11 is a block diagram illustrating power supply by an impedance measuring apparatus according to an embodiment of the present disclosure.

FIG. 11 is a block diagram illustrating power supply by an impedance measuring apparatus according to an embodiment of the present disclosure.

Referring to FIG. 11, a power supplier 1110 provides the power received through a USB port 1100 to the impedance measuring apparatus 900. For example, the power supplier 1110 isolates a first voltage (e.g., 4.2 to 5.5V) received through the USB port 1100, through a transformer, and may boost (e.g., a DC-to-DC converter) the isolated voltage to a second voltage (e.g., a constant voltage of 5V and 15V) required by the impedance measuring apparatus 900 and provide a result of the boosting to the impedance measuring apparatus 900. As described above with reference to FIGS. 9 and 10, the impedance measuring apparatus 900 does not need large power because it is sufficient to apply a small sine wave signal of several m to several V to the gate voltages of the MOSFETs 925 and 1030, and thus may be driven with low power supplied through the USB port 1100.

Because the impedance measuring apparatus 900 may be driven by being connected to the USB port 1100, the impedance measuring apparatus 900 may be used by being connected to various electronic devices (e.g., a computer, a notebook computer, a tablet PC, and a smartphone) having the USB port 1100, and the impedance measuring apparatus 900 may output the measured impedance value to the outside in real time through the USB port 1100. When an electronic device connected to the USB port 1100 is a device capable of wired/wireless communication, the impedance measuring apparatus 900 may transmit the measured impedance value to an external device in real time through wired/wireless communication.

In another embodiment, because the impedance measuring apparatus 900 is able to be connected to various electronic devices through a USB port, the impedance measuring apparatus 900 may display an impedance measurement result through an electronic device connected to the USB port 1100, without including a separate display for outputting the impedance measurement result through a screen or the like. Of course, there may be a display in the impedance measuring apparatus 900.

Figure 12:
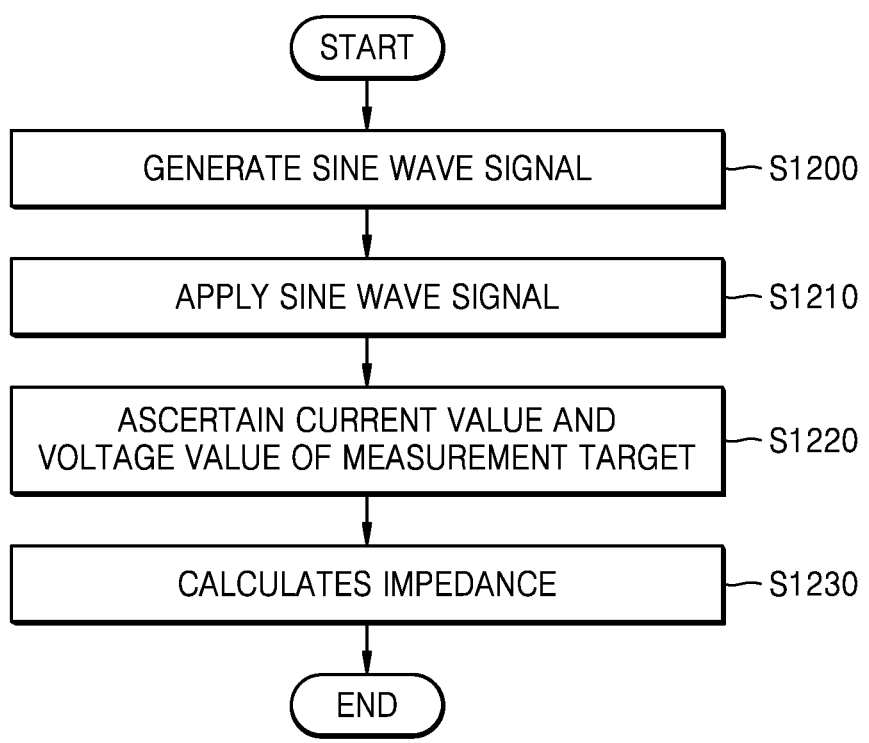
FIG. 12 is a flowchart of an example of an impedance measuring method according to an embodiment of the present disclosure.

FIG. 12 is a flowchart of an example of an impedance measuring method according to an embodiment of the present disclosure.

Referring to FIGS. 9 and 12 together, the impedance measuring apparatus 900 generates a sine wave signal within a certain frequency range (S1200). The impedance measuring apparatus 900 applies the sine wave signal to the gate voltage of the MOSFET 925 connected to the measurement target (S1210). The impedance measuring apparatus 900 measures the current value output by the source electrode of the MOSFET 925 and the voltage value output by the measurement target 990 according to the application of the sine wave signal (S1220). The impedance measuring apparatus 900 calculates the impedance of the measurement target 990, based on the current value and the voltage value (S1230).

FIG. 13 is a view illustrating an example of a sine wave signal generated to achieve impedance measurement according to an embodiment of the present disclosure.

Referring to FIG. 13, the impedance measuring apparatus 900 may generate a plurality of sine wave signals at log intervals in a certain frequency range 1300. For example, the impedance measuring apparatus 900 measures the impedance of the measurement target by outputting a sine wave signal having a frequency of $f_0$ for a certain time period, and then measures the impedance of the measurement target by outputting a sine wave signal ten times greater than $f^0$ (i.e., $2f_0(\log)$) for a certain time period. In this way, the impedance measuring apparatus 900 measures the impedance of the measurement target by generating a sine wave signal having frequencies 1310, 1320, and 1330 arranged at log intervals within a certain frequency range. The frequency range for generating a sine wave signal and the number of sine wave signals of different frequencies, for example, may be variously set according to embodiments, and embodiments of the present disclosure do not need to be limited to the log intervals.

Figure 14:
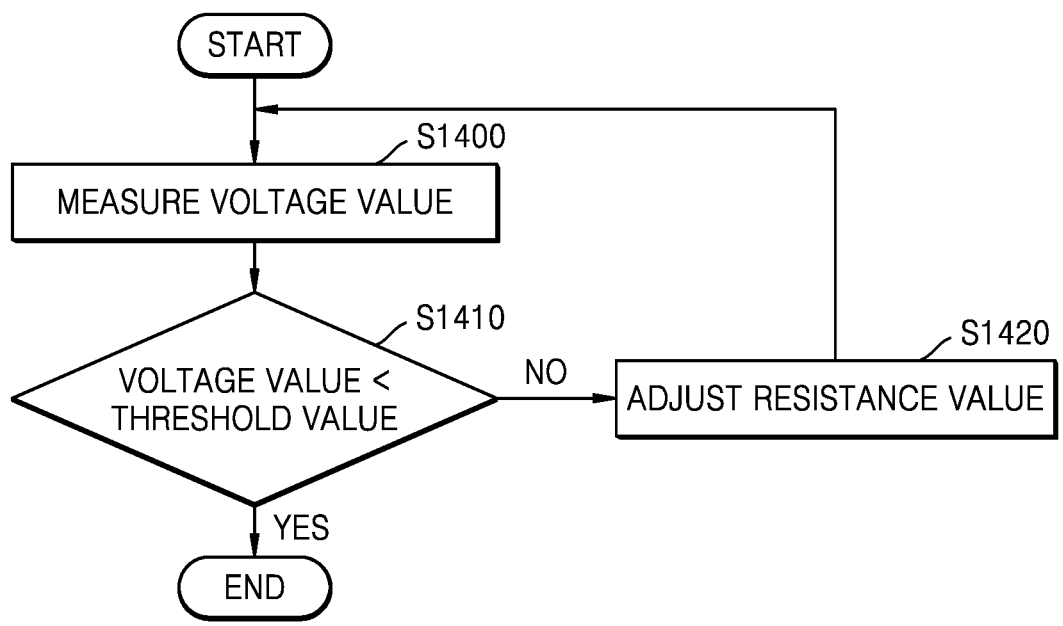
FIG. 14 is a flowchart of an example of a method of changing a resistance value of a resistor unit, according to an embodiment of the present disclosure.

FIG. 14 is a flowchart of an example of a method of changing a resistance value of a resistor unit, according to an embodiment of the present disclosure.

Referring to FIGS. 9 and 14, the controller 960 of the impedance measuring apparatus 900 controls each of the switches of the switch unit 1050 to be in an on state so that a required current flows through each resistor. The controller 960 ascertains the voltage value of the resistor unit 1040 (S1400). When the voltage value of the resistor unit 1040 is less than a pre-defined threshold value, the controller 960 changes connection of at least one of the plurality of connected switches to an off state (S1420) so that the current flowing through each resistor increases. In other words, when the magnitude of the current increases, the voltage value of the resistor unit increases. The controller 960 repeatedly changes the state of the switch until the voltage value of the resistor unit 1040 is greater than the threshold value. For example, the resistors connected to one another in parallel in the resistor unit 1040 may have the same resistance value or different resistance values. The controller 960 may control the switch unit 1050 to be turned off sequentially from the connection of the resistors having large resistance values so that the magnitudes of the currents flowing through the resistors of the resistor unit 1040 sequentially increase from a small value.

Damage to an impedance measuring apparatus due to excessive current may be prevented by distributing a current to each resistor even when the magnitude of the voltage, etc. of the measurement target 990 is not set in advance, and also the size of the resistance value of the resistor unit 1040 may be adjusted to be suitable for measuring the impedance of the measurement target 990.

Each embodiment of the present disclosure can be embodied as computer readable codes on a computer readable recording medium. The computer readable recording medium is any type of recording device that stores data which can thereafter be read by a computer system. Examples of the computer readable recording medium include ROM, RAM, CD-ROM, a solid-state drive (SSD), and an optical data storage device. The computer readable recording medium can also be distributed over network coupled computer systems so that the computer readable code is stored and executed in a distributive manner.

While the present disclosure has been particularly shown and described with reference to embodiments thereof, it will be understood by those of ordinary skill in the art that various changes in form and details may be made therein without departing from the spirit and scope of the disclosure as defined by the appended claims. It should be understood that the disclosed embodiments should be considered in a descriptive sense only and not for purposes of limitation. Therefore, the scope of the present disclosure is defined not by the detailed description of the present disclosure but by the appended claims, and all differences within the scope will be construed as being included in the present disclosure.

The invention claimed is:

1. A battery diagnosis method performed by a computing device that drives a battery prediction model trained to predict battery state information, the battery diagnosis method comprising:
   receiving time series data including at least one of voltages, currents, and temperatures of a battery sequentially measured for a certain time period;
   receiving non-time series data including battery impedance measured at a certain time point; and
   predicting the battery state information by inputting the time series data and the non-time series data to the battery prediction model,
   wherein, training data for the battery prediction model comprises time series training data of at least one of a voltage, a current, and a temperature measured for a certain time period for a plurality of battery samples, non-time series training data includes impedances of the plurality of battery samples, and validation data includes battery state information, and
   the battery prediction model is a supervised learning model made by comparing the validation data with prediction data based on the time series training data and the non-time series training data, wherein the battery prediction model comprises a recursive neural network and a fully connected layer,
wherein the predicting comprises:
generating a first feature value by inputting the time series data to the recursive neural network;
generating a second feature value by concatenating the first feature value with the non-time series data; and
inputting the second feature value to the fully connected layer.

2. The battery diagnosis method of claim 1, wherein the non-time series data is impedance information measured by applying at least two sine wave signals of different frequencies to the battery.

3. The battery diagnosis method of claim 1, further comprising optimizing a hyperparameter of the battery prediction model,
wherein the optimizing comprises:
training the battery prediction model by using pre-defined training data and a plurality of pre-defined candidate hyperparameters;
selecting at least two top candidate hyperparameters as parent hyperparameters, based on fitness evaluation of the battery prediction model trained based on each of the candidate hyperparameters;
generating at least one new candidate hyperparameter through intersection or transformation between the parent hyperparameters; and
repeating a process of selecting parent hyperparameters again based on fitness evaluation of the battery prediction model trained based on the new candidate hyperparameter and generating a new candidate hyperparameter, until a predefined condition is met or a predefined number of times is reached.

4. A non-transitory computer-readable recording medium having recorded thereon a computer program, which, when executed by a computer, performs the method of claim 1.

* * * * *